United States Patent [19]

Macho

[11] 4,317,116
[45] Feb. 23, 1982

[54] ARRANGEMENT FOR THE GENERATION OF A SIGNAL IN PROPORTION TO A CAPACITY

[75] Inventor: Franz Macho, Marxzell-Pfaffenrot, Fed. Rep. of Germany

[73] Assignee: VEGA Vertrieb und Fertigung Elektronischer Gerate und Apparate Grieshaber KG, Wolfach, Fed. Rep. of Germany

[21] Appl. No.: 111,785

[22] Filed: Jan. 14, 1980

[30] Foreign Application Priority Data

Jan. 16, 1979 [DE] Fed. Rep. of Germany ....... 2901516

[51] Int. Cl.³ .............................................. G08C 19/10
[52] U.S. Cl. .............................. 340/870.39; 324/60 R; 340/870.37; 340/870.42
[58] Field of Search .... 340/177 R, 177 VC, 177 VA, 340/210, 200, 186, 187, 623, 620, 870.37, 870.39, 870.38, 870.42, 870.43; 324/60 R, 60 C, 61 R, 61 P, 62, 65 R, 65 P, 57 R, DIG. 1; 73/305, 307, 308, 313

[56] References Cited

U.S. PATENT DOCUMENTS

| | | | |
|---|---|---|---|
| 3,646,538 | 2/1972 | Frick | 340/200 |
| 3,948,098 | 4/1976 | Richardson et al. | 340/186 |
| 3,975,719 | 8/1976 | Frick | 340/210 |
| 4,084,155 | 4/1978 | Herzl et al. | 340/210 |
| 4,146,834 | 3/1979 | Maltby et al. | 340/210 |
| 4,205,327 | 5/1980 | Dahlke | 340/210 |

*Primary Examiner*—James J. Groody
*Attorney, Agent, or Firm*—Dennison, Meserole, Pollack & Scheiner

[57] ABSTRACT

An active measuring converter for connection between a two-wire line and an impedance to be measured, wherein an oscillator supplies alternating voltage to the impedance, and the variation in current drawn by the oscillator is in accordance with the value of the impedance. The measurement signal is transmitted together with the power for the active measuring converter via a two-wire line. The oscillator supplies the impedance with stabilized AC voltage independent of its operating current. Electronic switching devices coupled to the impedance either add the alternating current to the measuring signal as an impressed current, or couple it to a resistor-capacitor network for establishing a reference input for the controlled variable voltage. The alternate coupling of the alternating current corresponds to the alternating polarity of the AC current flowing through the impedance. The impedance may be the capacitance of a sonde which varies according to filling level. The converter draws a minimum of current and may be adjusted for any given measurement conditions.

18 Claims, 1 Drawing Figure

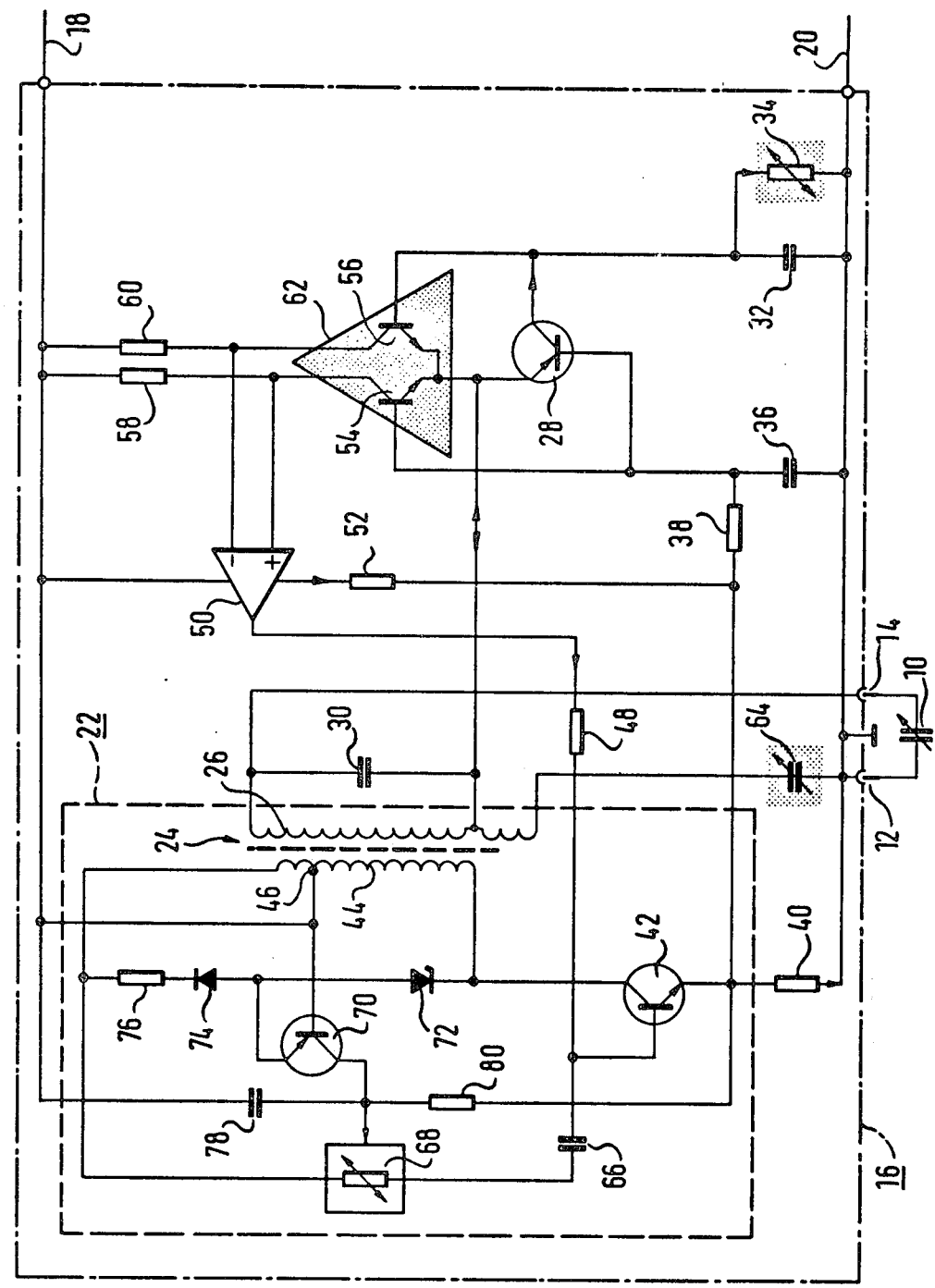

ARRANGEMENT FOR THE GENERATION OF A SIGNAL IN PROPORTION TO A CAPACITY

BACKGROUND OF THE INVENTION

The invention relates to circuitry for generating a signal proportional to an impedance to be measured, wherein a two-wire connection is made to the impedance via an active measuring converter having an oscillator for supplying the impedance with a stabilized alternating voltage.

Such measuring systems are known, for example, in German Pat. No. 1,249,404. In addition to an oscillator the active measuring converter comprises a measuring circuit having an emitter coupled transistor, and a capacitor and the impedance to be measured in parallel in the emitter circuit of a coil. A two-wire connection couples the measuring signal to an A.C./D.C. voltage converter connected to a voltmeter. Power is supplied to the measuring connection from a separate D.C. voltage line source. One side of the D.C. voltage source and one measuring point connection are connected to ground.

Very often, when there are great distances between the measuring points and the place for evaluating the measurements, active measuring converters will be located at the objects to be measured. The signals from the measuring converters for each measuring point are transmitted to the place of evaluation via two-conductor lines. On the two-conductor line there can be transmitted both the current for supplying the active measuring converter and the signal current representing the measured physical value. For example, one can supply 4 mA direct current for operating the respective measuring converter while a range of 16 mA may be used for the transmission of the measuring signal. The cable expenses can be reduced considerably. If the active measuring converter converts the measuring signals into direct current signals, no specially adapted signal converters can be supplied by an uncritical D.C. supply. The supply voltage, however, should not fall below a minimum limit of 12 volts while the maximum limit usually must be at 36 volts.

To determine filling height levels in tanks, capacitance differences are measured by sondes which, according to the filling height, are completely, partially or not at all covered. Generally such capacitance devices are subjected to great losses. In addition to the purely capacitive current the oscillator of the measuring converter must therefore meet a loss of current, which depends upon the voltage applied to the sonde. This voltage cannot be chosen as low as one would like because this will result in an unfavorable ratio of useful to interfering signals, impairing the accuracy of the measurement. However, if one increases the output voltage of the oscillator in order to avoid this unfavorable useful/interfering ratio, then an operating current of 4 mA for the oscillator does not suffice.

Difficulties arising if the operating current is too high as compared to the measuring current can be avoided by transmitting the measuring signal as a superposed alternating component on the two-wire line while direct current is supplied to the measuring converter. For an alternating component one can use a signal with variable frequency. The measured quantities can also be digitalized and coupled as coded pulses to the two-wire line. Such transmission methods require expensive coding circuitry in the active measuring converter. Decoding systems are required at the receiving end of the two-wire line. Further, the transmission is prone to interferences, since voltages and currents received from foreign A.C. sources will influence the measured quantities. There will also be interference coming from the measured quantities in the form of alternating components, due to electric and magnetic couplings to adjacent lines. Interfering radiation can also be produced at higher transmission frequencies or pulse transmission frequencies. Thus, one cannot use inexpensive direct current measuring via one of the conductors and a moving-coil indicator.

Measuring converters having waveforms deviating from the sine curve will be radio jamming sources due to their content of strong high-frequency upper harmonics. Therefore in most cases it is not permitted to use them.

SUMMARY OF THE INVENTION

It is the object of the invention to further develop circuitry wherein direct currents representing the measured quantities can be transmitted beside the operating current of the measuring converter, whereby the measuring converter has a large useful signal range, and is not influenced by variations in the measuring converter elements caused by changes in temperature or other conditions.

The invention achieves this object in that via a two-wire system the measuring signal is transmitted together with the power for the active measuring converter; an oscillator supplies the impedance with stabilized A.C. voltage independently of its operating current input; electronic switching devices are arranged in series with the impedance, which, depending upon the alternating polarity of the A.C. flowing through the impedance, either add the alternating current to the measuring signal as impressed current or couple it to a resistor and a capacitor for establishing a reference input of a controlled variable voltage. The actual value of the controlled variable voltage is proportional to the current flowing through the active measuring converter. A regulating circuit is responsive to oscillator signal variation to control the current coupled to the oscillator, such that a portion of current in accordance with the measuring signal is admitted to the two-wire connection. The control system regulates the current in the two-wire connection and minimizes the effects of interfering influences such as supply voltage fluctuations, variations in temperature, or changed measuring element characteristics due to fatigue. The oscillator generates a sinusoidal voltage, whereby interfering radiations caused by upper harmonics of higher frequency are obviated. Coding circuitry in the measuring converter and decoding circuitry at the receiving end are not required. With this arrangement there can be a large ratio of measuring signal to rest signal. Therefore it is possible to make full use of the range for measuring signal current transmission, e.g. the range between 4 and 20 mA. Another advantage is that available circuits can process currents varying between 4 and 20 mA at the place of evaluation. For very precise measurements the ratio of measuring current to rest current can be easily increased to 10:1. With this arrangement loss-affected or pure reactances, as well as ohmic resistances, can be measured.

In a preferred embodiment current is coupled to the oscillator through a resistor. The voltage drop across the resistor represents the actual value of the controlled variable voltage. The inputs of a differential amplifier are coupled to receive an established reference value and the actual value. The output of the differential amplifier is connected to the regulating circuit of the oscillator. This arrangement is especially economical and of simple construction.

Preferably the oscillator includes a transformer, the secondary circuit of which is coupled to the impedance to be measured. Independently of the operating voltage on the two-wire connecting line, the supply voltage for the impedance (e.g., the capacity of sondes in a tank) can be optimized for existing conditions. If the impedance to be measured is very low, it is necessary to set the voltage of the measuring circuit higher than the operating voltage on the two-wire line.

In the preferred embodiment, the resistor for coupling current to the oscillator and the resistor provided for establishing a reference value of the controlled variable voltage have different values. The voltages across the two resistors are almost equal due to very little deviation. If the resistor which couples the oscillator current is smaller than the resistor which establishes the reference value, then small changes in the current flowing through the sonde capacitor cause large changes in the current coupled to the oscillator. Thus, by appropriately selecting the resistance value of the resistor which couples the oscillator current, the range of signal current changes on the two-wire line can be set. Therefore, the arrangement, in a rather simple manner, can be set such that it provides a measuring converter signal with a 4 mA rest current and a measuring signal current varying between 3 and 20 mA.

In another preferred embodiment outputs from the oscillator are coupled, respectively, via a capacitor to a reference potential and via an emitter-collector path of a transistor, to a resistor and the capacitor. The base of the transistor is connected to the resistor which couples current to the oscillator. A second differential amplifier is provided which receives at its respective inputs the actual and nominal values of the controlled variable voltage. The second differential amplifier feeds the first differential amplifier, and operates alternately as a differential amplifier and as an electronic switching device, coupling the current passing through the capacitor.

In this arrangement, a second difference amplifier is utilized in two ways. On the one hand, this differential amplifier serves to generate an amplified difference signal for controlling the regulating unit via the first differential amplifier. On the other hand, the second differential amplifier rectifies the measuring current through the sonde capacitance. Currents flowing through the two transistors of the second differential amplifier are proportional to the voltage differences at the bases. The sum of the two currents is proportional to the current in the low-potential circuit. The inputs of the second difference amplifier can receive input voltages up to zero volts without any current consumption through that output of the measuring transformer not connected to the switching devices of the differential amplifier. The operating current of the first differential amplifier is controlled and does not increase the rest current of the measuring transformer, without control. In the above arrangement there is no limitation of the voltages at the resistors for establishing the reference value or the actual value. Therefore, in a given case, the voltages can be set to maximum advantage by selecting corresponding resistances.

Preferably, current from the impedance is coupled by the second differential amplifier during one half period, and by a switching transistor during the other half period. This current processing maintains the symmetry of the currents flowing through the impedance in two half periods, and results in a high accuracy of measurement.

The two half-period currents produce an impressed measuring signal-direct current on the two-wire line. This current is independent of the distance between the impedance and the place of evaluation.

In another preferred embodiment, one input of the second differential amplifier is coupled by a resistor to receive the oscillator current. The other input is coupled to a resistor and a capacitor. The second differential amplifier includes two transistors having their emitters connected to one output from the oscillator. The switching transistors have their collectors coupled to resistors and to the inputs of the first differential amplifier. This arrangement is of rather simple construction and yields a high accuracy of measurement.

Preferably, the second differential amplifier is only supplied with operating current during its operation as an electronic switching element.

It is advantageous if the second differential amplifier uses operating current only during a half period of the current in the impedance, the operating current being proportional to the current through the impedance. Thus, a separate portion of supply current is not required for the second differential amplifier. This results in a favorable ratio of measuring signal to rest signal.

In still another preferred embodiment the oscillator includes a transistor, wherein the collector-emitter path couples operating current to the resistor which determines the actual value of the controlled variable voltage. The base of the transistor is connected to the output of the first differential amplifier. Thus, the first differential amplifier controls the current input to the oscillator via the transistor. Therefore the first transistor acts as a regulating device to reduce signal deviation.

Preferably, the transistor of the oscillator serves as a regulating device in two ways, by fixing the current and, at the same time and independently thereof, by regulating or maintaining a stabilized alternating voltage. Thus, the transistor is used for multiple purposes, and the construction of the active measuring converter is simplified.

In a further advantageous embodiment, a circuit parallel to the transformer primary winding in the oscillator includes in series: a semi-conductor diode, and a diode and a resistor for stabilizing the alternating voltage from the oscillator. This stabilization is independent of the control of the operating current through a very large range. This range can be set by the selection of the supply voltage and the break-off voltage of the semiconductor diode.

In another preferred embodiment, the primary winding of the transformer is tapped and connected to the base of an additional transistor. The emitter of this transistor is connected to the anodes of the semiconductor diode and the diode, and the collector of the additional transistor is coupled to the control electrode of a variable resistance. The variable resistance is connected in series with a capacitor, between one side of the primary winding and the base of the first transistor in the oscillator, in order to precisely adjust the stabilized alternating voltage. This arrangement will stabilize the voltage available at the measuring impedance, with great accuracy. The transistor monitors the maximum of the measuring alternating voltage and, according to the level, dynamically acts on the oscillatortransistor via a variable resistance and a capacitor, as it couples operating current to the oscillator.

It is advantageous to use a common resistance for the transistor of the oscillator and as the actual value resistance, as this will simplify construction.

Preferably, the above-mentioned variable resistance is a field effect transistor. With this arrangement, the variable resistance can be controlled with very little power, so that the portion of supply current used for dynamic stabilization of the alternating voltage is negligibly small.

Advantageously the resistance for the actual value or the resistance for establishing the reference value are adjustable. By means of these resistances the measuring distance between the place of measurement and the place of evaluation can be variably compensated. The arrangement can be easily adapted to existing conditions at the place of measurement, which may present a changed impedance for the measuring signal.

In another favorable embodiment the secondary winding of the transformer is tapped. That portion of the winding positioned between the tap and the end thereof is coupled to an adjustable capacitor. With this arrangement, an initial capacitance can be set at the start of the measurement.

Further details, characteristics and advantages of the invention will be apparent from the following description of the drawing of an exemplary embodiment.

BRIEF DESCRIPTION OF THE DRAWING

The drawing FIGURE is an electrical schematic diagram showing in detail a circuit for providing a signal proportional to a capacitance to be measured.

DESCRIPTION OF THE PREFERRED EMBODIMENT

With reference to the drawing FIGURE, the impedance to be measured refers to the capacitance of a probe for checking the height of the filling level in a tank. This capacitance to be measured, shown as variable capacitor 10, is connected by plug-in connectors 12 and 14 to a circuit 16 for generating a signal proportional to the capacitance 10. According to the level of fill in the tank covering the probe there will be a different value of the capacitance 10.

Via leads 18 and 20 of a two-wire line the circuitry is connected to an evaluation apparatus (not shown) at a distance. The circuit 16 represents an active measuring converter, arranged close to the capacitance 10, and is supplied with operating current via the leads 18 and 20. Via the leads 18 and 20 the measuring converter 16 also receives direct current proportional to the capacitance. Therefore, both currents are superimposed on each other on the leads 18 and 20.

The active measuring converter 16 comprises an oscillator 22 with a transformer 24. The secondary winding 26 of the transformer 24 is connected on one side to the plug-in connector 14. A tap from the secondary winding 26 is coupled to the emitter of transistor 28. Parallel to the tap and the one side of the secondary winding 26 is capacitor 30, the capacitance of which together with the inductance of the transformer 24 produces a resonant circuit. The collector of the transistor 28 is coupled to one terminal of capacitor 32, the other terminal of which is connected via lead 20 to ground potential. An adjustable resistor 34 is coupled parallel to capacitor 32.

The base of the transistor 28 is connected to one terminal of a second capacitor 36, and on to resistor 38 for further coupling to resistor 40. Resistor 40 is connected between lead 20 and the emitter of transistor 42, which is a component of the oscillator 22. The collector of transistor 42 is coupled to one side of the primary winding 44 of the transformer 24. Primary winding 44 is connected to lead 18 via tap 46. The base of transistor 42 is coupled via resistor 48 to the output of a first differential amplifier 50. The current supply terminals of differential amplifier 50 are connected to lead 18 and, via resistor 52, to the emitter of transistor 42.

The emitter of transistor 28 is coupled to the emitters of transistors 54 and 56 which define a second differential amplifier 62. The collector resistances 58 and 60 are supplied with positive voltage through lead 18. The inverting input of first difference amplifier 50 is connected to the collector of transistor 56, while the non-inverting input is connected to the collector of transistor 54. The base of transistor 54 is connected to the base of transistor 28. The base of transistor 56 is connected to a terminal of capacitor 32 and resistor 34.

The second end of secondary winding 26 is coupled via adjustable capacitor 64 to lead 20 which has reference potential.

The base of transistor 42 is further connected to the second end of primary winding 44 via capacitor 66 and variable resistor 68. The variable resistor 68 is preferably a field effect transistor, having its control electrode coupled to the collector of transistor 70. The base of transistor 70 is connected to the tap 46. Parallel to the two ends of primary winding 44 there is a series connection of semiconductor diode 72, diode 74 and resistor 76. The anodes of semiconductor diode 72 and diode 74 are connected to each other and to the emitter of transistor 70. Between lead 18 and the collector of transistor 70 is another capacitor 78. The collector of transistor 70 is connected to resistor 40 via resistor 80. As shown in the drawing figure, the circuit elements 42, 66, 68, 70, 72, 74, 78 and 80 constitute further components of the oscillator 22.

Oscillator 22 generates a stabilized alternating voltage, in a way that will later be explained in more detail. The stabilized alternating voltage available at secondary winding 26 provides a current through capacitance 10. This alternating current is proportional to capacitance 10. The half-wave cycles of current are conducted through different paths. The positive half-wave charges capacitor 32 via transistor 28. Thereby a D.C. voltage proportional to capacitance 10 develops at capacitor 32, which is dropped across resistor 34. The voltage existing at resistor 34 will be used as the reference value of the controlled variable voltage in a control system in the following manner. A component of the control system is the resistor 40. The supply current of oscillator 22 and the supply current of the first differential amplifier 50 pass through resistor 40. These currents cause a voltage drop across resistor 40, and this defines the actual value of the controlled variable voltage.

The actual value voltage is coupled to the base of transistor 56 of differential amplifier 62, while the reference value appears at the base of transistor 54. The voltage dropped across resistor 40 is led to transistor 54, and is smoothed by capacitor 36 in conjunction with resistor 38.

The collectors of transistors 54 and 56 provide a difference voltage which is coupled to first differential amplifier 50. The second differential amplifier 62, in addition to its actual function of difference amplification, further rectifies the negative half-wave cycle of current through capacitance 10. The current is divided in differential amplifier 62. Transistor 56 measures the reference value and transistor 54 the actual value. These different values are responsive to different collector currents. The two collector currents together produce the measuring signal current and flow as an impressed current over the positive output terminal of the measuring converter 16. However, as the difference is kept very small, the two collector currents are practically identical. Due to the dual functioning of differential amplifier 62 the inputs can receive voltages up to zero volts without drawing any current from the negative output terminal of the measuring converter 16 at lead 20.

Differential amplifier 50 produces an amplified signal proportional to the difference, which signal is coupled via resistor 48 to the base of transistor 42, which path defines the flow of operating current to oscillator 22. Therefore, transistor 42 serves as a regulating device for the control system comprising the elements 32, 34, 36, 38, 40, 42, 48, 50, 58, 60, and 62. The controlled variable of this control system is the operating current of oscillator 22. According to the sign and the amount of the difference between the reference and the actual values, the base current of transistor 42 is either increased or decreased so that by adapting the actual value a reduction in the difference will result. The supply current of first difference amplifier 50 flows through resistor 52 to resistor 40 and thus, will be included in the actual value.

The value of the voltage at the collector of transistor 28 is dependent upon the value of variable resistance 34. This voltage, by the control, is likewise produced across resistor 40 and at the base of transistor 28. Therefore, a constant collector-base-voltage appears at transistor 28. Capacitor 36 smooths the reference value voltage dropped across resistor 40, and also provides A.C. coupling to the bases of transistors 28 and 54. The same applies to capacitor 32 with respect to transistor 56.

The above circuit arrangement allows current flow at both sine half-waves. In one half-period transistor 28 conducts the current through capacitance 10, and in the other half-period the second differential amplifier 62 conducts. This results in many advantages. First, the symmetry of the currents flowing through the capacitance in the two half periods is maintained, and second, the susceptibility to interferences is very small.

Thus, both half-waves of the current passing capacitance 10 produce an impressed current on the leads 18 and 20 which is independent of the line impedance.

By means of the capacitance of capacitor 64 the starting point of the measurement can be set.

Current consumption of oscillator 22 depends upon the losses of the oscillatory circuit, the losses at the control of the stabilized alternating voltage, and on the energy fed to the capacitance 10, which in the case of loss-affected capacitances will be an especially high percentage. When measuring filling level by means of capacitive probes, the currents in the loss resistances at low filling levels are small and they increase with rising filling levels. At maximum filling level there will be the greatest loss effect, causing a corresponding maximum load on oscillator 22. At low filling levels there are small capacitive currents in addition to small loss currents, and the consumption of rest current by oscillator 22 is rather small too. The consumption of rest current by oscillator 22 can be fixed, e.g. at 4 mA, for an initial value by setting variable capacitor 64. This minimum current is continuously flowing through leads 18 and 20. This low current is achieved by the operation of the second difference amplifier 62 which is supplied with current only when acting as an electronic switching element. Thus, the second difference amplifier will consume a supply current only during half a period of the current passing through the capacitance, which working current is proportional to the current in the capacitance 10.

Therefore a portion of the rest current is not required to supply the second difference amplifier.

With an increase in capacitance to be measured, the control system will require a higher current which will be superimposed on the rest current as measuring signal current. This additional current flowing over leads 18 and 20 is proportional to capacitance 10 and can be processed later in an evaluation circuit (not shown). By this control, the influence of variations in temperature or changes in the operating characteristics of the elements of the oscillator, e.g. due to fatigue, on the measuring signal current transmitted via leads 18 and 20 is eliminated.

The oscillator 22 is provided with a second control system, which generates a stable unvarying alternating voltage. This alternating voltage must stay constant in spite of variable current intake by the oscillator and varying loading on the measuring circuit.

When the voltage at the primary winding 44 reaches a value equal to the sum of the voltage of the semiconductor diode 72 and the voltage of the diode 74, then a current starts to flow in this branch, which is connected in parallel to the primary winding 44. The primary winding 44 is loaded by the resistance 76. Thereby a kind of "elastic voltage clamping" is obtained, i.e. the increase in voltage is delayed. Thus, diode 74, semiconductor diode 72, and resistor 76 cause a flat stabilization of the alternating voltage for capacitance 10.

In addition to this flat stabilization, transistor 70 and variable resistance 68 provide a very accurate sharp stabilization. Transistor 70 additionally monitors the voltage at primary winding 44. The influence of variations in temperature on the base-emitter-voltage of transistor 70 is compensated by semiconductor diode 72.

When semiconductor diode 72 conducts, a potential will develop at the emitter of transistor 70. The value of the semiconductor voltage is lower than the maximum voltage provided by the lower part of the primary winding 44. As soon as this potential exceeds the base potential, transistor 70 becomes conductive and changes the state of field effect transistor 68. Thereby, the resistance increases in the base circuit of transistor 42. This resistance provides a voltage to transistor 42 which leads to a reduction in the collector alternating current. This voltage comes from that part of the primary winding 44 arranged between tap 46 and at the terminal of resistor 76.

Thus, the current supplied via transistor 70, resistor 68, and capacitor 66 opposes the increase of voltage in the primary winding of the transformer 24 and limits the amplitude to a steady value.

Therefore, the second control loop, comprising transistor 70, field effect transistor 68 and capacitor 66 acts dynamically (exclusively), on the regulating device, transistor 42. Both control systems are decoupled from each other and thus work independently of each other. Transistor 42 is thereby used for several purposes, resulting in considerably simplified construction of measuring converter 16.

Also, resistor 34, which conducts oscillator current, performs several functions at the same time. On the one hand this resistor serves as an operating resistance in the emitter circuit of the oscillator, and on the other hand it serves to produce the actual value of the controlled variable voltage. This arrangement further reduces construction expense of measuring converter 16.

In order that the collector current of transistor 42 can be dependent on the base-alternating voltage, emitter resistance 40 must not be bridged-over by a capacitor.

High-ohmic resistors 38, 52 and 80 are inserted in the leads to the emitter of transistor 42 so that it is not influenced by other dynamic signals. The mean value of the actual value appears at the integrator comprising resistor 38 and capacitor 36. Capacitor 78 smooths the operation of the field effect transistor 68.

Measuring range can be adjusted via resistor 34. If for example a change of the measuring signal current from 4 mA to 20 mA is desired, this can be effected by a corresponding adjustment of resistor 34. The active measuring converter 16 can by means of capacitor 64 and resistor 34, be adapted to the condition of a probe such that a standard basic signal is coupled to leads 18 and 20.

Alternatively resistor 40, which couples oscillator current, can be made variable, and the measuring range can similarly be varied.

I claim:

1. In a system for generating a measurement signal proportional to an impedance to be measured, comprising an active supplying operating current to said measuring converter and receiving said measurement signal, said measuring converter being coupled between said two-wire line and said impedance to be measured and comprising:

oscillator means for generating an alternating current signal, said oscillator means including regulating means for stabilizing said alternating current signal, and means for coupling said alternating current signal to said impedance;

control circuit means coupled between said oscillator means and said two-wire line, said control circuit means comprising switching means coupled to said oscillator means, first differential amplifier means coupled to said oscillator means for generating an output signal in accordance with the difference between the alternating current signal and a reference signal, and second differential amplifier means coupled between said first differential amplifier means and said first switching means, said second differential amplifier means being responsive to the polarity of said alternating current signal to couple said alternating current signal to said two-wire line at one polarity of said alternating current signal, said switching means being responsive to the polarity of said alternating current signal to couple said alternating current signal to a reference signal establishing circuit at the other polarity of said alternating current signal, said reference signal establishing circuit providing said reference signal and being coupled between said second differential amplifier means and said two-wire line; and wherein the alternating current oscillator signal current is controlled by said first differential amplifier means and said regulating means and varies in accordance with said impedance, whereby said two-wire line receives a measurement signal current in accordance with the impedance measured.

2. A system according to claim 1, wherein said impedance is capacitive and said measurement signal is proportional to the capacitance of said impedance to be measured.

3. A system according to claim 1, wherein said reference signal establishing circuit includes variable resistor means for setting a reference signal voltage.

4. A system according to claim 3, further comprising resistor means coupled between said oscillator means and said impedance, the voltage drop across said resistor means being the actual value of a controlled variable voltage, said second differential amplifier means having inputs coupled to receive said actual value voltage and said reference signal voltage, and wherein the output of said second differential amplifier means is coupled to said regulating means.

5. A system according to claim 4, wherein said resistor means coupled between said oscillator means and said impedance is variable for setting said actual value voltage.

6. A system according to claim 4, wherein said oscillator means further comprises transformer means, said transformer means having a secondary winding coupled to said impedance to be measured.

7. A system according to claim 6, further comprising a variable capacitor coupled between said transformer means secondary winding and said impedance to be measured.

8. A system according to claim 6, wherein said transformer means has a primary winding, said primary winding having in parallel thereto a series coupled semiconductor diode means, diode means, and a second resistor means for stabilizing said alternating current signal.

9. A system according to claim 8, further comprising variable resistance means coupled to said transformer means primary winding, transistor means coupled to said variable resistance means, said diode means having its anode coupled to the anode of the semiconductor diode means, the emitter of said transistor means coupled to the anodes of said semiconductor diode means and said diode means, the base of said transistor means coupled to said primary winding, the collector of said transistor means coupled to said variable resistance means.

10. A system according to claim 9, wherein said variable resistance means comprises a field effect transistor.

11. A system according to claim 4, wherein said regulating means comprises a transistor, the base of said transistor being coupled to the output of said first differential amplifier means, the collector-emitter path of said transistor being coupled to said resistor means, whereby the current through said collector-emitter path determines said actual value voltage across said resistor means.

12. A system according to claim 11, wherein said resistor means both biases said transistor and provides said actual value voltage.

13. A system according to claim 11, wherein said transistor both regulates said oscillator means current and maintains a stabilized alternating current signal.

14. A system according to claim 11, wherein current is coupled from said impedance by said second differential amplifier means during one half-period of said alternating current signal and by said switching means during the other half-period of said alternating current signal, and further comprising means for coupling said current to the two-wire line during both half-periods of said alternating current signal to provide said measurement signal.

15. A system according to claim 14, wherein said second difference amplifier means draws current only during one half-period of said alternating current signal, said current drawn being proportional to the current coupled from said impedance.

16. A system according to claim 1, wherein said second differential amplifier means comprises two transistors having their emitters coupled together and to an output from said oscillator means, said first differential amplifier means having at least two inputs, said two transistors having respective collector resistor means coupled to respective inputs of said first differential amplifier means.

17. A system according to claim 1, further comprising integrating means coupled between said regulating means and an input of said second differential amplifier means.

18. A system according to claim 1, wherein said first differential amplifier means has at least two outputs, further comprising resistor means coupled between a first output of said first differential amplifier means and said oscillator means, and resistor means coupled between a second output of said first differential amplifier means, and said regulating means for reducing the influence of possible interfering signals. /

* * * * *